United States Patent
Spurdens et al.

[11] Patent Number: 6,036,769
[45] Date of Patent: Mar. 14, 2000

[54] PREPARATION OF SEMICONDUCTOR SUBSTRATES

[75] Inventors: Paul C. Spurdens, Woodbridge; Mark A. Salter, Ipswich; Michael J. Harlow, Ipswich; David J. Newson, Ipswich, all of United Kingdom

[73] Assignee: British Telecommunications Public Limited Company, London, United Kingdom

[21] Appl. No.: 08/816,742

[22] Filed: Dec. 30, 1996

Related U.S. Application Data

[63] Continuation of application No. PCT/GB95/01541, Jun. 29, 1995, which is a continuation-in-part of application No. 08/289,118, Aug. 11, 1994, abandoned.

[30] Foreign Application Priority Data

Jun. 29, 1994 [EP] European Pat. Off. ............... 94304754

[51] Int. Cl.[7] ...................................................... C20B 1/04
[52] U.S. Cl. ..................................... 117/2; 117/3; 117/953
[58] Field of Search ..................... 117/2, 3, 953

[56] References Cited

U.S. PATENT DOCUMENTS

| | | | |
|---|---|---|---|
| 4,629,532 | 12/1986 | Yanase et al. ............................. | 117/94 |
| 4,660,208 | 4/1987 | Johnston, Jr. et al. ................... | 437/129 |
| 4,999,315 | 3/1991 | Johnston et al. .......................... | 117/102 |
| 5,242,857 | 9/1993 | Cooper et al. ............................ | 437/129 |

FOREIGN PATENT DOCUMENTS

| | | | |
|---|---|---|---|
| 63-207119 | 8/1988 | Japan ........................................ | 117/94 |
| 1-226798 | 11/1989 | Japan ........................................ | 117/3 |
| 2-239199 | 9/1990 | Japan ........................................ | 117/3 |
| 3-279299 | 10/1991 | Japan ........................................ | 117/3 |

OTHER PUBLICATIONS

Ishikawa et al, "Origin of n–Type Conduction at the Interface Between Epitaxial–Grown Layer and InP Substrate and its Suppression by Heating in Phosphine Atmosphere", Journal of Applied Physics, Apr. 15, 1992, USA, vol. 71, No. 8, ISSN 0021–8979, pp. 3898–3903.

Patent Abstracts of Japan, vol. 015, No. 397 (E–1120), Oct. 8, 1991 & JP,A,03 161922 (NEC Corp) Jul. 11, 1991.

Ishikawa et al, "Highly Resistive Iron–Doped AlInAs Layers Grown by Metalorganic Chemical Vapor Deposition", Japanese Journal of Applied Physics, Part 2 (Letters), Apr. 1, 1992, Japan, vol. 31, No. 4A, ISSN 0021–4922, pp. L376–L378.

Patent Abstracts of Japan, vol. 013, No. 549 (C–662), Dec. 7, 1989 & JP,A,01,226796 (Sumitomo Electric Ind Ltd) Sep. 11, 1989.

*Primary Examiner*—Robert Kunemund
*Attorney, Agent, or Firm*—Nixon & Vanderhye P.C.

[57] ABSTRACT

An indium phosphate semiconductor substrate is prepared for subsequent growth of epitaxial layers to form a semiconductor device. In the preparation, the substrate is first annealed to promote any tendency for surface accumulation of impurity atoms by diffusion from the substrate and to promote impurity atom removal from the surface of the substrate. The substrate is then surface etched to remove further impurities and to provide a clean, flat surface for subsequent epitaxial layer growth. The final stage of preparation involves growing a semi-insulating buffer layer on the substrate to isolate the device epitaxial layers from the substrate.

46 Claims, 1 Drawing Sheet

PREPARATION OF SEMICONDUCTOR SUBSTRATES

CROSS-REFERENCE TO RELATED APPLICATION

This application is a continuation (under 35 USC §120/365) of PCT/GB95/01541 designating the U.S. and filed Jun. 29, 1995 as, in turn, a continuation-in-part (under 35 USC §120/365) of U.S. application Ser. No. 08/289,118 filed Aug. 11, 1994 (now abandoned).

BACKGROUND OF THE INVENTION

1. Field of the Invention

The present invention relates to the production of semiconductor devices and in particular to the preparation of indium phosphide semiconductor substrates for use in the production of semiconductor devices using MOVPE techniques.

2. Related Art

MOVPE (Metal Organic Vapour Phase Epitaxy) is commonly used to grow a wide variety of semiconductor devices comprising multiple layers which require precise material composition and thickness. In some materials systems, virtually monolayer control can be achieved using MOVPE when switching from one compound to another which in some cases is essential for accurate, repeatable device fabrication. The achievable purity of deposited layers using MOVPE is potentially very high but can be affected by the purity of the starting products. As long as the starting products are not totally pure, device manufacturers have to take steps to avoid or counter the unpredictable effects that the impurities have on manufacturing processes, or suffer from reduced device yield.

It has been shown that epitaxially deposited III–V semiconductors commonly suffer from the presence of conductive interfacial layers at the substrate interface [1].

This phenomenon presents a particular problem to InP based field effect transistors (FETs) grown on Fe-doped InP substrates because it prevents pinch-off by providing a parallel conduction path that cannot be controlled by gate voltage. This also raises output conductance, device-to-device leakage and can add a parasitic capacitance affecting high frequency performance.

Conducting interfacial layers can have many origins, however, the strongest recent evidence indicates accumulation of Si atoms at the substrate/epitaxial layer interface to be the major culprit [1]. Interfacial impurities have been variously attributed to out diffusion from the substrate, residues from substrate preparation solutions and contamination from ambient air. In addition, the inventors have observed Si accumulation in an MOVPE kit for several weeks following refurbishment of the vent-run gas switching manifold. Even when below detection limits in grown layers, this is another potential source of surface contamination during wafer heat-up. In practice, it is quite likely that several of these mechanisms may contribute to contamination simultaneously, varying in degree of severity depending on factors such as the substrate batch or manufacturer, its handling and preparation procedure, chemical batches and the history of the growth kit.

The significance of the accumulated silicon greatly increases as device complexity increases, since fabrication times increase giving the silicon more time to accumulate. Therefore, the production of highly integrated monolithic semiconductors including, for example, HFET (heterojunction field effect transistors), lasers and transmitters, HEMTs (high electron mobility transistors) and OEICs (opto-electronic integrated circuits) has highlighted the need to overcome the problem.

Many workers have developed processes for mitigating parallel conduction in FETs and HEMTs. Recently, H. Ishikawa et al in "Origin of n-type conduction at the interface between epitaxial-grown layer and InP substrate and its suppression by heating in phosphine atmosphere", J. Appl. Phys 71(8), 15 April 1992, pp 3898–3903, described a study into the origins of n-type conduction due to Si atoms at the epitaxial layer-substrate interface. In the study Ishikawa et al theorised that Si atoms originated in the air, possibly from the filters used in clean rooms, and became adsorbed into the InP. The adsorbed Si subsequently accumulated at the epitaxial layer-substrate interface and manifested itself as n-type impurities causing n-type conduction at the boundary. To counter this, Ishikawa et al proposed a method of removing the atoms from the InP substrate by annealing it in a $PH_3$ atmosphere, The process involved heating the InP to a temperature of around 700° C. for 20 minutes with a $PH_3$ flow rate of 1200 sccm. The results indicated that a high proportion of the Si atoms adsorbed into the InP surface were desorbed, which reduced the effect of n-type Si conduction.

In another paper, "Highly Resistive Iron-doped AlInAs layers grown by Metalorganic Chemical Vapour Deposition", J. Appl. Phys. Vol. 31 (1992) pp L376–L378, Ishikawa et al described a method of fabricating a semi-insulating iron-doped AlInAs buffer layer on an InP substrate prior to the deposition of further epitaxially-grown layers. By this method, the influence of the substrate itself, over the epitaxially-grown layers, is mitigated.

Although the existence of parallel conduction mechanisms has been recognised for at least 10 years, and more recently the causes of the mechanisms, for example n-type conduction by silicon atoms, have been isolated, surprisingly, none of the proposed methods of overcoming or countering the effects of the mechanisms have proved entirely satisfactory. In such a rapidly growing and important field as III–V semiconductor device fabrication, a method of successfully and reproducibly fabricating devices without parallel conduction mechanisms would be of extreme commercial importance.

SUMMARY OF THE INVENTION

Therefore, in accordance with one aspect, the present invention provides a method of preparing a semiconductor substrate for subsequent growth of epitaxial layers, the method comprising the steps of, annealing the substrate to reduce the concentration of impurity atoms present on or in the substrate, and thereafter, growing one or more buffer layers on the substrate, the or at least one of the buffer layers comprising a semiconductor material doped with metal atoms.

The annealing step promotes any tendency for surface accumulation of impurities, for example silicon atoms, by diffusion from the bulk substrate. Also, annealing promotes impurity atom removal from the substrate surface.

For the example of annealing an InP substrate, impurity atoms, for example silicon atoms, in or on the substrate are replaced with phosphorus atoms. The annealing is carried out at a temperature which is high enough to promote high mobility of surface atoms on the substrate. The phosphorus atoms are transported in a flow of gaseous phosphine, or other suitable phosphorus containing compound which yields phosphorus atoms, the flow rate being great enough to maintain an overpressure which prevents net loss of phosphorus atoms due to heating. It has been shown [2] that the rate of removal of silicon impurity atoms is proportional to the heating time, the heating temperature and the flow rate of phosphine. Therefore, the maximum benefit from annealing can be achieved by maximising the values in the annealing process. However, the values should in practice be set for practicality, i.e. so that the annealing step does not take too long, phosphine flow is not so high that filters become blocked, etc. It is expected that some benefit would accrue at a temperature as low as 600° C., for a time as short as 5 minutes and with the minimum phosphine flow sufficient to stabilise the InP surface at the anneal temperature.

Substrates other than InP are typically annealed in atmospheres comprising other suitable conditions. For example, for a GaAs substrate, the annealing step is carried out in an atmosphere typically comprising arsine.

It is clear that strict compliance with specific values for the annealing process is not necessary and that the values may be traded off against each other.

For example, a higher heating temperature would require a shorter heating time.

The buffer layer (or layers) provide(s) a semi-insulating barrier between the substrate and subsequently grown epitaxial layers to reduce the influence the substrate has over the nature and performance of the subsequently grown epitaxial layers.

For III/V compounds such as doped GaAs or doped GaAlAs, semi-insulating layers can be epitaxially grown by MOVPE by varying the III/V ratio. Increasing the III/V ratio alters doped p-type GaAs or GaAlAs to n-type GaAs or GaAlAs, and vice versa. Near the point of conversion, the GaAs or GaAlAs exhibits high resistivity and can thus act as a semi-insulating layer.

In the case of undoped InP, layers grown by MOVPE generally show n-type conduction indicating that undoped AlInAs layers cannot form highly resistive (semi-insulating) buffer layers by varying the III/V ratio. However, it has been shown that doping an InP layer with iron reduces n-type conduction in the InP. This is also the case with doping AlInAs with iron.

It has been shown that iron atoms cancel the affects of n-type carriers, in effect forming 'carrier traps', and that the higher the iron concentration, the greater the insulating properties of the iron doped InP or AlInAs [3].

At least one buffer layer is deposited on the semiconductor substrate using MOVPE growth techniques. In the case of InP, the buffer layer is doped with iron to increase the resistance of the buffer layer by allowing the electrically active iron atoms to act as deep carrier traps for the n-type carriers. Alternatively, other semi-insulating dopants such as cobalt (Co) and rhodium (Rh) are expected to be effective alternatives dopants to iron to act as n-type carrier traps, although, in most cases the resistivity of the InP will be lower.

Other dopants, for example chromium, have been seen to act as p-type carrier traps in InP and GaAs. In general, for a dopant to act as an effective carrier trap, it is a requirement that it sits as closely as possible to the centre of the band-gap of the base material in which it is doped. Then, the dopant, and hence any trapped carriers, are as far away as possible from both the valance and conduction bands of the base material making carrier escape through thermal or electrical excitation difficult. As a result, the doped base material increases greatly in resistivity. Obviously, a dopant is selected for its ability to act either as a p-type carrier trap or as an n-type carrier trap in dependence on the type of conduction, for example due to the presence of impurities, exhibited by the base material.

The inventors have shown that a combination of annealing and a subsequently grown semi-insulating buffer layer is an effective method of greatly reducing the effects of conducting interfacial layers, in most cases. However, in some cases, for example in a case where a substrate boule proves to be particularly susceptible to parallel conduction mechanisms, a further step is included in the preparatory stages of a substrate to offer greater protection against the vagaries of substrate quality.

The further step is an etch step, which is carried out between the annealing step and the buffer layering step. The etch step removes any surface contaminants from the substrate, for example oxygen or oxides which may have contaminated the substrate from the atmosphere in which the boule is stored or transported, and provides a clean, flat surface on which subsequent epitaxial layers can be grown. The inventors have shown that any etching process, and indeed any etchant, for example phosphorus trichloride to etch InP, which is shown to provide non-preferential etching (i.e. polish etching), without unduly roughening the substrate surface, is suitable for the etching step. The inventors have also shown that gas-etching provides better results than wet-etching because gas-etching is carried out in-situ, providing exclusion of impurities that may re-contaminate the surface of the substrate. Preferably, no more than about 1um (that is to say, the first few monolayers) of surface substrate is removed to provide a substrate surface of the required cleanliness.

BRIEF DESCRIPTION OF THE DRAWINGS

The invention will now be described in greater detail, by way of example, with reference to the following drawings, in which.

DETAILED DESCRIPTION OF EXEMPLARY EMBODIMENTS

Figure 1:
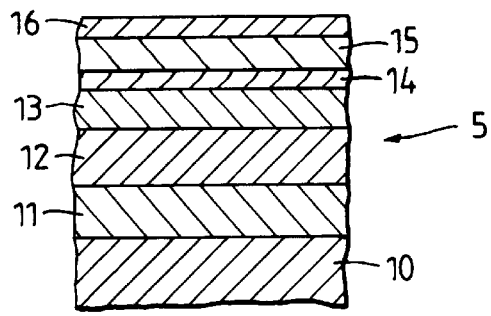
FIG. 1 shows a typical HFET structure.

An iron-doped InP substrate was prepared for subsequent epitaxial HFET device growth as follows.

The iron-doped InP substrate was installed in an atmospheric pressure MOVPE reactor. For the annealing stage, the substrate was heated to a temperature of around 750° C., in the reactor, in an atmosphere of phosphine and highly pure hydrogen.

At around 400° C. the surface of an InP substrate becomes unstable unless phosphine or a similar gas is present in the atmosphere to stabilise the surface.

Typically, therefore, a phosphine flow should be present during the whole substrate heating process, or at least from around 400° C. upwards.

The rate of impurity silicon atom removal from a substrate due to the annealing step has been reported to be proportional to the heating time and substrate temperature [2].

The substrate was annealed at 750° C. for 30 minutes with a phosphine flow of 46 sccm (standard cubic centimetres per minute), to provide a partial overpressure of $7 \times 10^{-3}$ atm. This temperature, time and phosphine flow were all set to the maximum practical levels which the MOVPE reactor could sustain to maximise the promotion of any tendency for surface accumulation of impurities from the bulk substrate, and also to promote Si removal by exchange of impurity atoms on the substrate surface with those of phosphine. The best results were achieved at 750° C. under 46 sccm phosphine (100%) diluted with $H_2$ at a flow rate of 6.3 liters/minute The next stage of preparation involved gas-etching the substrate, again at atmospheric pressure, at an etching temperature of 400° C. for 25 minutes in a mixture of phosphorus trichloride and high purity hydrogen. The etching step was carried out straight after the annealing step without removing the substrate from the MOVPE reactor. The temperature in the reactor was reduced from 750° C. to 400° C. whilst maintaining the flow of annealing phosphine to maintain the stability of the surface of the substrate. When the etching temperature was reached, the phosphine flow was switched off and replaced with a 50 sccm phosphorus trichloride flow diluted with a high purity hydrogen carrier having a flow rate of 6.3 liters/minute. The phosphorus trichloride was contained in a bubbler held at 0° C. and its vapour transported into the reactor at a rate of $9.5 \times 10^{-5}$ mole per minute by the hydrogen (carrier) gas. The flows and etching temperature were determined by calibration and were those found optimal for non-preferential etching at a controlled and reproducible rate of 1 $\mu$m per hour.

After the completion of the etching step under phosphorus trichloride, the flow of phosphine was re-instated to maintain the surface of the substrate in a stable state during a period taken to heat the substrate from 400° C. to 650° C. The buffer layers were grown at 650° C. using a conventional MOVPE process.

Any set of MOVPE growth conditions which allow deposition of semi-insulating AlInAs alloys (lattice matched to InP to ±1000 ppm) and semi-insulating InP would be suitable.

There are three buffer layers—a bottom layer of iron-doped AlInAs, a middle layer of iron-doped InP and a top, capping, layer of undoped InP.

The iron-doped AlInAs was grown, at 650° C., in an atmosphere of: trimethylaluminium @ $6.7 \times 10^{-6}$ mol/cm$^3$; trimethylindium @ $2.4 \times 10^{-5}$ mol/cm$^3$; and, arsine (100%) @ $3 \times 10^{-3}$ mol/cm$^3$, providing a growth rate of 3.0 $\mu$m per hour.

The combination of the different bottom layer and middle layer materials gives the benefits of the wide AlInAs bandgap and the higher resistivity of the Fe—InP. The former is unnecessary in most situations. Dopant sources were ferrocene and hydrogen sulphide. With optimised Al and AsH$_3$ sources the kit was capable of growing at 650° C. undoped AlInAs with background doping level of $1-2 \times 10^{15}$ cm$^{-3}$. The iron concentration in both the AlInAs layer and the InP layer was $2 \times 10^{17}$ cm$^{-3}$ which was the maximum achievable solubility of iron in the substrate. This concentration was chosen to maximise the concentration of electrically active deep carrier traps. Lower concentrations can be used but obviously with a possible reduction in trap effectiveness for a given layer thickness. Higher concentrations are unlikely to increase the effectiveness of the trap.

HFET structures were grown on substrates prepared according to conventional methods and also according to the present method. The HFETs were then tested for their pinch-off characteristics.

The typical structure of the HFETs tested is shown in FIG. 1. The HFET structures were grown by atmospheric pressure MOVPE using conventional methyl metal group III and hydride group V precursors. The basic HFET structure 5, grown on top of the buffer layer 11, lattice matched to a semi-insulating iron-doped (100) InP substrate 10, consisted of the following layers: 0.3 $\mu$m undoped InP 12, 70 nm S doped GaInAs ($2 \times 10^{17}$ cm$^{-3}$ n-type) 13, 5 nm undoped GaAlAs 14, 50 nm undoped AlInAs 15, 5 nm undoped InP 16. The element ratios should be those which give lattice matching to InP to ±1000 ppm.

The HFETs were fabricated with 100 $\mu$m wide, 1 $\mu$m long gates using the process which is described in detail in D. J. Newson et al, "Damage-free passivation of InAlAs/InGaAs HFETs by use of ECR-deposited SiN", Electronics letters 1993, 29, pp472–474, the contents of which are incorporated herein by reference.

The results of the experimental pinch-off tests are correlated in Table 1. The table also shows the conditions from which the results were derived. The devices were designed to pinch-off fully before −2V gate bias. The criterion used in the table is pinch-off before −5V as such gross deviations are well outside doping control limits of the MOVPE kit used and must be substrate interface related. The first test approach (batches 1 to 9) was to load substrates as supplied because experience indicated that almost anything done to the Fe-doped material led to poorer epilayer morphology. However, this approach, even when combined with a variety of buffer layer types, only once led to good pinch-off (batch 6), and this was not reproducible.

Figure 2:
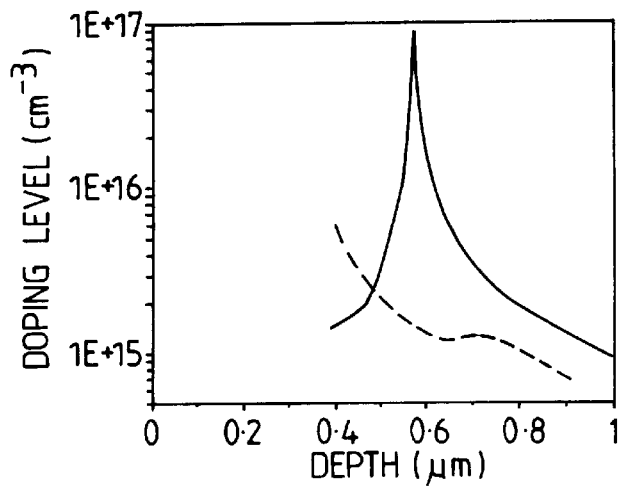
FIG. 2 shows typical capacitance/voltage depth profiles of HFETs tested in the course of experiment.

In every case, when wafers or corresponding test structures from this series were electrochemical capacitance/voltage (CV) depth profiled, a large interfacial n-type spike in the range $5 \times 10^{16}$ to $5 \times 10^{17}$ cm$^{-3}$ was found, as shown in FIG. 2 (solid line). This n-type spike was at a depth which corresponded to the substrate/epitaxial layer interface and was a good indication that parallel conduction mechanisms, and hence poor pinch-off characteristics, arose from this spike.

TABLE 1 showing the pinch-off performance of various HFETs fabricated on substrates prepared in variou ways (u indicates undoped, Fe indicates iron-doped)

| BATCH | BOULE | SUBSTRATE PREPARATION | BUFFER LAYER | NUMBER TESTED | NUMBER WITH GOOD PINCH-OFF |
|---|---|---|---|---|---|
| 1 | C | NONE | 0.3 $\mu$m u-InP | 5 | 0 |
| 2 | K | NONE | 0.3 $\mu$m u-InP | 1 | 0 |
| 3 | K | NONE | 0.1 $\mu$m Fe-InP, 0.3 $\mu$m u-InP | 3 | 0 |
| 4 | K | NONE | 0.1 $\mu$m u-AlInAs, 0.3 $\mu$m u-InP | 1 | 0 |
| 5 | S | NONE | 0.1 $\mu$m u-AlInAs, 0.3 $\mu$m u-InP | 2 | 0 |

TABLE 1-continued showing the pinch-off performance of various HFETs fabricated
on substrates prepared in variou ways (u indicates undoped, Fe indicates iron-doped)

| BATCH | BOULE | SUBSTRATE PREPARATION | BUFFER LAYER | NUMBER TESTED | NUMBER WITH GOOD PINCH-OFF |
|---|---|---|---|---|---|
| 6 | S | NONE | 5 nm u-GainAs, 0.1 μm u-AllnAs, 0.3 μm u-InP | 2 | 1 |
| 7 | S | NONE | 5 nm u-InP, Snm u-GainAs, 100 nm u-AllnAs | 1 | 0 |
| 8 | S | NONE | 0.1 μm Fe-InP, 0.3 m u-InP | 2 | 0 |
| 9 | S | NONE | 0.4 μm u-InP | 1 | 0 |
| 10 | S | WET ETCH | 0.1 μm Fe-InP, 0.3 μm u-InP | 5 | 3 |
| 11 | S | WET ETCH | 0.1 μm Fe-AllnAs, 0.3 μm u-InP | 1 | 1 |
| 12 | S | ANNEAL & GAS ETCH. | 0.1 μm Fe-InP, 0.3 μm u-InP | 1 | 1 |
| 13 | S | ANNEAL & GAS ETCH | 0.1 μm Fe-AllnAs, 0.3 μm Fe-Inp, 0.3 μm u-InP | 2 | 2 |
| 14 | Z | ANNEAL & GAS ETCH | 0.1 μm Fe-AllnAs, 0.3 μm Fe-Inp, 0.3 μm u-InP | 1 | 1 |
| 15 | F | ANNEAL | 0.1 μm Fe-AllnAs, 0.3 μm Fe-InP, 0.3 μm u-InP | 1 | 1 |
| 16 | F | ANNEAL & GAS ETCH | 0.1 μm Fe-AllnAs, 0.3 μm Fe-InP, 0.3 μm u-InP | 2 | 2 |

Trials with InP test layers showed that a wet-etch which included a bromine-methanol step, in combination with growth of a thin, semi-insulating Fe-doped InP or AlInAs anti-spike layer, was capable, in most cases, of substantially reducing or eliminating the CV n-type spike. When this was put into the HFET process (batches 10 and 11), a much higher success rate was achieved, 4 out of 6 wafers. Unfortunately though, some failures were still obtained, even within a single substrate batch.

Trials with HFETs grown on substrates prepared according to the present invention (batches 12 to 16) provided a 100% success rate. Substrate interfacial Trials with HFETs grown on substrates prepared according to the present invention (batches 12 to 16) provided a 100% success rate. Substrate interfacial layers thus grown were always semi-insulating or low n-type by CV profiler (FIG. 2, dashed line). Again, note that although batches 12 to 16 all used a gas etch, the invention does extend to the use of a wet or other type of etch.

Although one wafer proved good (batch 15) even without the etching step, the reproducibility of this was not explored because the etching step is thought to offer greater protection against the vagaries of substrate quality (boule Z was from a source reported to be particularly susceptible to parallel conduction problems).

Figure 3:
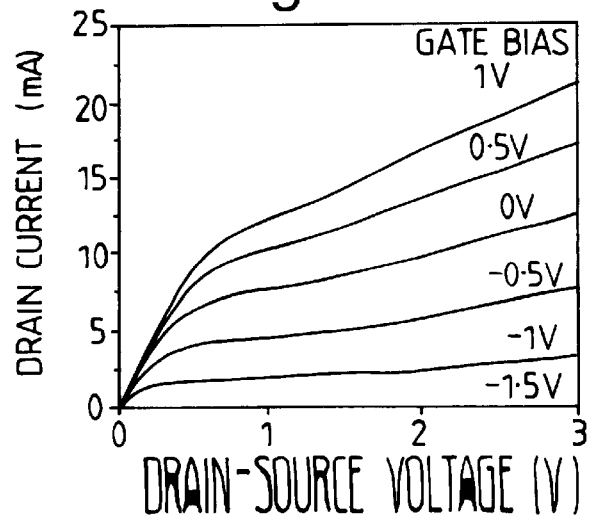
FIG. 3 shows a typical set of HFET characteristics obtained from an HFET fabricated on a substrate prepared according to the present invention.

FIG. 3 shows a set of HFET characteristics obtained from HFETs fabricated on substrates prepared by the method according to the present invention. From the graph it can be seen that pinch-off occurs at less than 2V.

While the method of substrate preparation described above finds particular application in the field of HFET fabrication on InP substrates, it will be apparent that the technique finds important application in the general field of semiconductor device fabrication. In particular, the method is not limited to the steps described above for fabricating a standard HFET. The method finds application in the fabrication of other types of semiconductor devices such as HEMTs (high electron mobility transistors) and optical devices such as lasers, and photo-detectors, or indeed any type of semiconductor device which requires high quality InP substrate preparation. Thus the precise details of layer composition, doping, thickness and of overall device dimensions are given by way of example only. Other devices, whether HFETs or otherwise, according to the invention will typically have very different characteristics to that described above. Nevertheless, the application of the present invention to the fabrication of semiconductor devices will be clear to those skilled in the art.

REFERENCES

1. N. Pan et al., "Low temperature InAlAs buffer layers using trimethylarsenic and arsine by metalorganic chemical vapour deposition", Appl. Phys. Lett., 1993, 63, pp3029–3031
2. H. Ishikawa et al., in "Origin of n-type conduction at the interface between epitaxial-grown layer and InP substrate and its suppression by heating in phosphine atmosphere", J. Appl. Phys 71(8), Apr. 15, 1992, pp 3898–3903
3. Ishikawa et al., "Highly Resistive Iron-doped AlInAs layers grown by Metalorganic Chemical Vapour Deposition", J. Appl. Phys. Vol. 31 (1992) pp L376–L378

What is claimed is:

1. A method of preparing a semiconductor substrate for subsequent growth of expitaxial layers, the method comprising the steps of:
   (a) annealing the substrate to reduce the concentration of impurity atoms present on or in the substrate; and thereafter
   (b) growing at least one buffer layer on the substrate, the at least one buffer layer comprising a semiconductor material doped with metal atoms and applied continuously across at least a portion of the substrate over which a device is to be later grown so as to insulate the entire device from the substrate.

2. A method according to claim 1 wherein the substrate comprises indium phosphide.

3. A method according to claim 2 wherein the annealing step is carried out in an atmosphere comprising phosphine.

4. A method according to claim 1 wherein at least one buffer layer comprises a semiconductor material doped with iron atoms.

5. A method according to claim 1 wherein at least one buffer layer comprises iron-doped InP.

6. A method according to claim 1 wherein at least one buffer layer comprises iron-doped AlInAs.

7. A method according to claim 1 wherein more than one buffer layer is grown, of which at least one buffer layer comprises iron-doped InP, and at least one other buffer layer comprises iron-doped InP, and at least one other buffer layer comprises iron-doped AlInAs.

8. A method according to claim 1 wherein the iron doping level(s) is in the order of $10^{16}$ to $10^{17}$ cm$^{-3}$.

9. A method according to claim 1 further comprising the step of:
etching the substrate surface to remove surface impurities,
wherein the etching step is carried out after the annealing step and before the buffer layer growing step; and
wherein the etching step is carried out after the annealing step and before the buffer layer growing step, all these steps being performed in situ in the same location.

10. A method according to claim 9 wherein the etching step includes heating the substrate in an atmosphere comprising phosphorus trichloride.

11. A method according to claim 10 wherein the atmosphere further comprises high purity hydrogen.

12. A method of fabricating a semiconductor device on a substrate, wherein the substrate is prepared according to claim 1.

13. A semiconductor device comprising a substrate and deposited thereon a plurality of epitaxial device layers, wherein the substrate is prepared according to claim 1.

14. A heterojunction field effect transistor prepared in accordance with claim 1 including, a first buffer layer comprising iron-doped AlInAs, a second buffer layer comprising iron-doped InP, and a third, capping, buffer layer comprising substantially un-doped InP.

15. A high electron mobility transistor formed on a substrate prepared in accordance with claim 1 including, a first buffer layer comprising iron-doped AlInAs, a second buffer layer comprising iron-doped InP, and a third, capping, buffer layer comprising un-doped InP.

16. An opto-electronic integrated circuit comprising at least one semiconductor optical component prepared according to claim 1.

17. An opto-electronic integrated circuit comprising at least one semiconductor optical component prepared according to claim 14.

18. An opto-electronic integrated circuit comprising at least one semiconductor optical component prepared according to claim 15.

19. A method of preparing a semiconductor substrate for subsequent manufacture of a semiconductor device, the method including:
reducing the concentration of impurity atoms present in or on said substrate by a process of annealing and
substantially insulating said semiconductor substrate from subsequent device layers by providing at least one buffer layer on said substrate, wherein the at least one buffer layer provides carrier traps for reducing conduction between said semiconductor substrate and said subsequent device layers,
said at least one buffer layer being applied continuously across at least a portion of the substrate over which a device is to be later grown so as to insulate the entire device from the substrate.

20. A method according to claim 19 wherein at lest one buffer layer comprises a III/V semiconductor in which the III/V ratio is arranged to provide a substantially electrically neutral material.

21. A method according to claim 19 wherein at least one buffer layer comprises a semiconductor material which when un-doped exhibits either n-type or p-type properties, said semiconductor material being doped with electrically-active atoms which provide the carrier traps.

22. A method according to claim 19 wherein said semiconductor material when un-doped exhibits n-type behavior and said electrically-active atoms are those of iron.

23. A method according to claim 19 wherein said semiconductor material when un-doped exhibits p-type behavior and said electrically-active atoms are those of chromium.

24. A method of preparing a semiconductor substrate for subsequent growth of epitaxial layers comprising a semiconductor device, the method comprising the steps of:
(a) annealing the substrate to reduce the concentration of impurity atoms present on or in the substrate; and thereafter
(b) growing one or more buffer layers on the substrate as a boundary between (a) active layers of the device and (b) the substrate, the or at least one of the buffer layers comprising a semiconductor material doped with metal atoms and applied continuously across the substrate to insulate the entire device from the substrate.

25. A method according to claim 24 wherein the substrate comprises indium phosphide.

26. A method according to claim 25 wherein the annealing step is carried out in an atmosphere comprising phosphine.

27. A method according to claim 24 wherein at least one buffer layer comprises a semiconductor material doped with iron atoms.

28. A method according to claim 24 wherein at least one buffer layer comprises iron-doped InP.

29. A method according to claim 24 wherein at least one buffer layer comprises iron-doped AlInAs.

30. A method according to claim 24 wherein more than one buffer layer is grown, of which at least one buffer layer comprises iron-doped InP, and at least one other buffer layer comprises iron-doped InP, and at least one other buffer layer comprises iron-doped AlInAs.

31. A method according to claim 24 wherein the iron doping level(s) is in the order of $10^{16}$ to $10^{17}$ cm$^{-3}$.

32. A method according to claim 24 further comprising the step of etching the substrate surface to remove surface impurities, wherein the etching step is carried out after the annealing step and before the buffer layer growing step.

33. A method according to claim 32 wherein the etching step includes heating the substrate in an atmosphere comprising phosphorus trichloride.

34. A method according to claim 33 wherein the atmosphere further comprises high purity hydrogen.

35. A method of fabricating a semiconductor device on a substrate, wherein the substrate is prepared according to claim 24.

36. A semiconductor device comprising a substrate and deposited thereon a plurality of epitaxial device layers, wherein the substrate is prepared according to claim 24.

37. A heterojunction field effect transistor prepared in accordance with claim 24 including, a first buffer layer comprising iron-doped AlInAs, a second buffer layer comprising iron-doped InP, and a third, capping, buffer layer comprising un-doped InP.

38. A high electron mobility transistor prepared in accordance with claim 24 including, a first buffer layer comprising iron-doped AlInAs, a second buffer layer comprising iron-doped InP, and a third, capping, buffer layer comprising un-doped InP.

39. An opto-electronic integrated circuit comprising at least one semiconductor optical component prepared according to claim 24.

40. An opt-electronic integrated circuit comprising at least one semiconductor optical component prepared according to claim 37.

41. An opto-electronic integrated circuit comprising at least one semiconductor optical component prepared according to claim 38.

42. A method of preparing a semiconductor substrate for subsequent manufacture of a semiconductor device thereon, the method including:

reducing the concentration of impurity atoms present in or on said substrate by a process of annealing, and substantially insulating said semiconductor substrate from subsequent device layers by providing one or more buffer layers on said substrate as a boundary between (a) the entirety of the active layers of the device and (b) the substrate, wherein the at least one buffer layer is applied continuously across the substrate to insulate the device from the substrate by providing carrier traps for reducing conduction between said semiconductor substrate and said subsequent device layers.

43. A method according to claim 42 wherein at least one buffer layer comprises a III/V semiconductor in which the III/V ratio is arranged to provide a substantially electrically neutral material.

44. A method according to claim 42 wherein at least one buffer layer comprises a semiconductor material which when un-doped exhibits either n-type or p-type properties, said semiconductor material being doped with electrically-active atoms which provide the carrier traps.

45. A method according to claim 42 wherein said semiconductor material when un-doped exhibits n-type behavior and said electrically-active atoms are those of iron.

46. A method according to claim 42 wherein said semiconductor material when un-doped exhibits p-type behavior and said electrically-active atoms are those of chromium.

* * * * *